United States Patent
Huang

(10) Patent No.: US 7,126,213 B2
(45) Date of Patent: Oct. 24, 2006

(54) RECTIFICATION CHIP TERMINAL STRUCTURE

(75) Inventor: Wen-Huo Huang, Hsinchu Hsien (TW)

(73) Assignee: Sung Jung Minute Industry, Co., LTD, Hsinchu Hsien (TW)

( * ) Notice: Subject to any disclaimer, the term of this patent is extended or adjusted under 35 U.S.C. 154(b) by 233 days.

(21) Appl. No.: 10/929,482

(22) Filed: Aug. 31, 2004

(65) Prior Publication Data

US 2006/0042833 A1  Mar. 2, 2006

(51) Int. Cl.
*H01L 23/06* (2006.01)

(52) U.S. Cl. ............. 257/684; 257/687; 257/696; 257/177; 257/690; 257/688; 174/267

(58) Field of Classification Search ............ 174/267, 174/52.2, 52.4, 52.5; 257/694, 658, 684, 257/177
See application file for complete search history.

(56) References Cited

U.S. PATENT DOCUMENTS

| | | | | |
|---|---|---|---|---|
| 5,005,069 A | * | 4/1991 | Wasmer et al. ............ | 257/687 |
| 5,424,594 A | * | 6/1995 | Saito et al. ............... | 310/68 D |
| 6,331,730 B1 | * | 12/2001 | Terasaki et al. ............ | 257/688 |
| 6,455,929 B1 | * | 9/2002 | Sheen ......................... | 257/690 |
| 6,667,545 B1 | * | 12/2003 | Spitz ......................... | 257/688 |
| 6,958,530 B1 | * | 10/2005 | Huang ........................ | 257/684 |
| 6,992,251 B1 | * | 1/2006 | Huang ........................ | 174/552 |
| 7,009,223 B1 | * | 3/2006 | Huang ........................ | 257/177 |
| 7,030,476 B1 | * | 4/2006 | Park et al. .................. | 257/678 |
| 2002/0145192 A1 | * | 10/2002 | Lin ............................ | 257/687 |
| 2005/0082692 A1 | * | 4/2005 | Park et al. .................. | 257/796 |

* cited by examiner

*Primary Examiner*—Ishwar Patel
*Assistant Examiner*—Hoa C. Nguyen
(74) *Attorney, Agent, or Firm*—Birch Stewart Kolasch & Birch, LLP

(57) ABSTRACT

A rectification chip terminal structure for soldering a rectification chip on a terminal filled with a packaging material to form a secured mounting for the rectification chip is to be inserted in a coupling bore of a circuit board. The structure includes a conductive element which has a buffer portion and a base seat to prevent bending and deformation under external forces, and has a stress buffer zone to prevent the chip from being damaged and moisture from entering. It can be installed easily in the coupling bore of the circuit board and hold the packaging material securely without breaking away.

3 Claims, 4 Drawing Sheets

RECTIFICATION CHIP TERMINAL STRUCTURE

FIELD OF THE INVENTION

The present invention relates to a rectification chip terminal structure and particularly to a terminal structure for power rectifiers.

BACKGROUND OF THE INVENTION

A conventional rectification terminal generally has a deck to hold a tin plate and a chip mounted onto the tin plate. The tin is heated and melted to solder the chip on the terminal deck, then the terminal is encased and packaged by plastics or resin.

The rectification chip terminal structure set forth above has many problems remained to be resolved. Two of the conventional structures are discussed below as reference.

Refer to FIG. 1 for a conventional rectification chip terminal structure. It includes a conductive element 10, a rectification chip 11 and a terminal portion 12. The conductive element 10 is thin and elongated. It has a low fatigue limit to withstand external forces. In the event that the external forces exceed the fatigue limit, the conductive element 10 tends to deform and break away from the chip, or even rupture. Moreover, the power distributor that uses the rectification chip terminal generates heat during operation and causes the conductive element 10 to expand at high temperature. This could cause soldering defect of the conductive element 10 and the rectification chip 11 and damage of the rectification chip 11. All this affects electric current running through the conductive element 10 and results in abnormal operation of the power distributor. It could even damage an engine. In addition, the terminal portion 12 thus designed is not easy to install and tends to damage the chip during installation and results in seeping of moisture. Furthermore, the packaging material is different from the terminal material, separation of these materials is prone to occur. All this shows that there are still rooms for improvement.

FIG. 2 illustrates the structure of another conventional rectification chip terminal. It includes a conductive element 20, a rectification chip 21, a terminal portion 22 and a bulged ring 24. The conductive element 20 is formed with a bending head which may sway back and forth to withstand external forces. The conductive element 20 thus formed has a greater fatigue limit. But it can bend only forwards and backwards. In the event that the external forces come from all directions, the forces from the left and right sides still will cause deformation of the conductive element 20 and affect electric current flowing through the conductive element 20. As a result, the power distributor distributes electricity unevenly and the engine might damage. While the bulged ring 24 can prevent moisture from seeping into the terminal through the inner wall, it cannot prevent the packaging material from separating and breaking away. Although the upper peripheral side has a smooth edge to facilitate insertion, there is also a latch means in the middle portion that has a larger outward angle than the upper edge. This makes insertion of the middle portion difficult. All other problems previously discussed still exist. The high temperature effect and expansion of the conductive element 20 during operation resulting from the power distributor, and the ensuing soldering defect and breaking down of the rectification chip 21 also exist. Although it has some alterations on the conductive element 20 and the structure, those problems remain to be resolved.

Based on previously discussion, it is clear that the conventional conductive element cannot totally prevent bending and deformation. The terminal portion is difficult to install and tends to cause many ill effects.

SUMMARY OF THE INVENTION

Therefore the primary object of the present invention is to solve the aforesaid disadvantages. The present invention provides an improved rectification chip terminal structure that can withstand external forces from all directions without exceeding the fatigue limit of the conductive element, and also overcome the problems resulting from the structure of the terminal portion.

The rectification chip terminal structure according to the invention includes:

a conductive element located above a rectification chip including a base to solder to the back side of the rectification chip, a root extending upwards from the base, and a buffer portion connecting to one end of the root that has a helical structure to prevent bending and deformation under external forces; and a base seat for holding the rectification chip. It is formed like a cup and has a housing space and a deck for soldering the rectification chip. The deck has a bulged ring extended upwards at a biased angle for coupling with the packaging material. The deck is surrounded by a spacer zone which is an annular groove to form a stress buffer zone. The spacer zone has a bending design to prevent moisture from seeping in through the inner wall of the terminal. The upper side of the inner wall has a bend spot to couple with the packaging material and prevent the moisture from seeping in. The upper peripheral side of the base seat further has a first tapered section inclining towards the center of the terminal to form an inclined angle and a second tapered section in the middle portion of the terminal periphery that has an inclined angle depending on the shrinking condition of the first tapered section. The base seat has a grip portion on a lower periphery that has a plurality of bulged traces on the peripheral surface except the lower rim to smooth insertion and avoid damaging an insulation fabric covered after installation.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
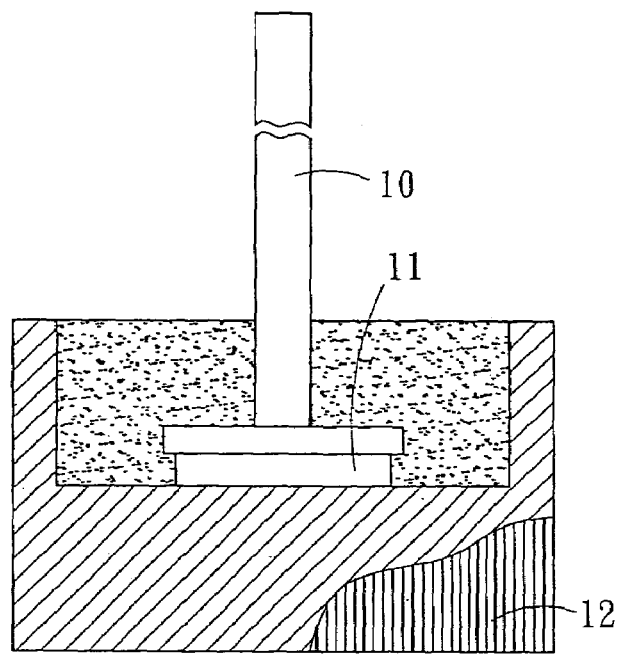
FIG. 1 is a schematic view of the structure of a conventional rectification chip terminal.
Figure 2:
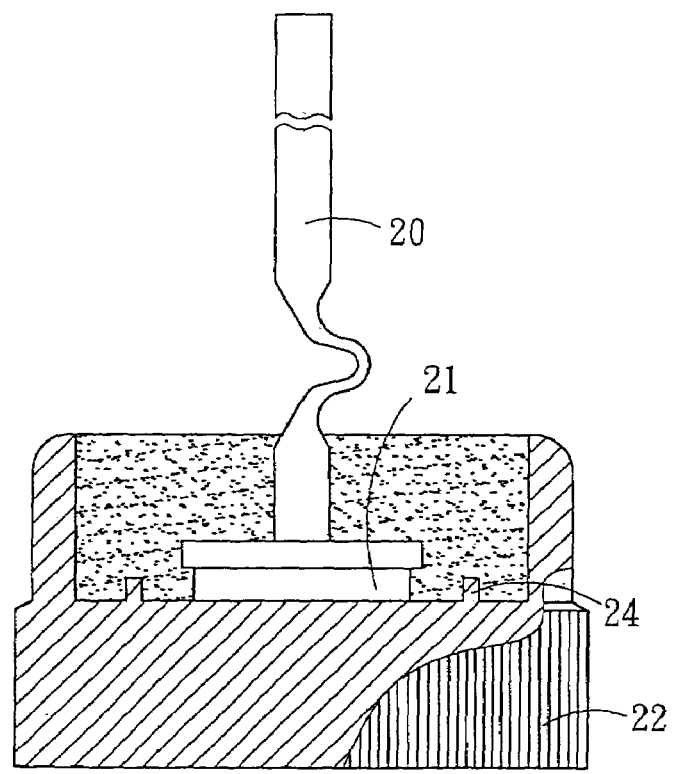
FIG. 2 is a schematic view of the structure of another conventional rectification chip terminal.
Figure 3:
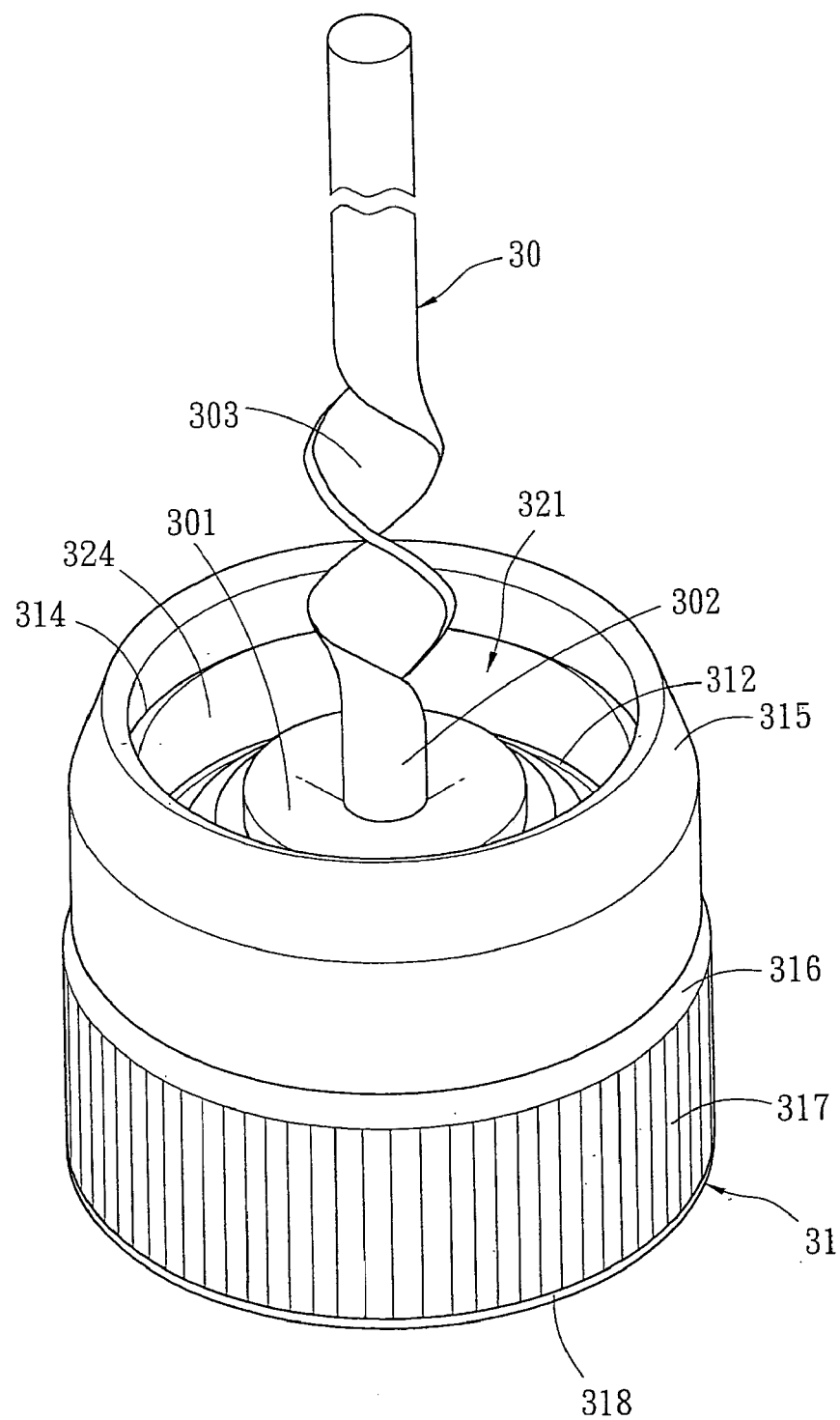
FIG. 3 is a perspective view of the present invention.
Figure 4:
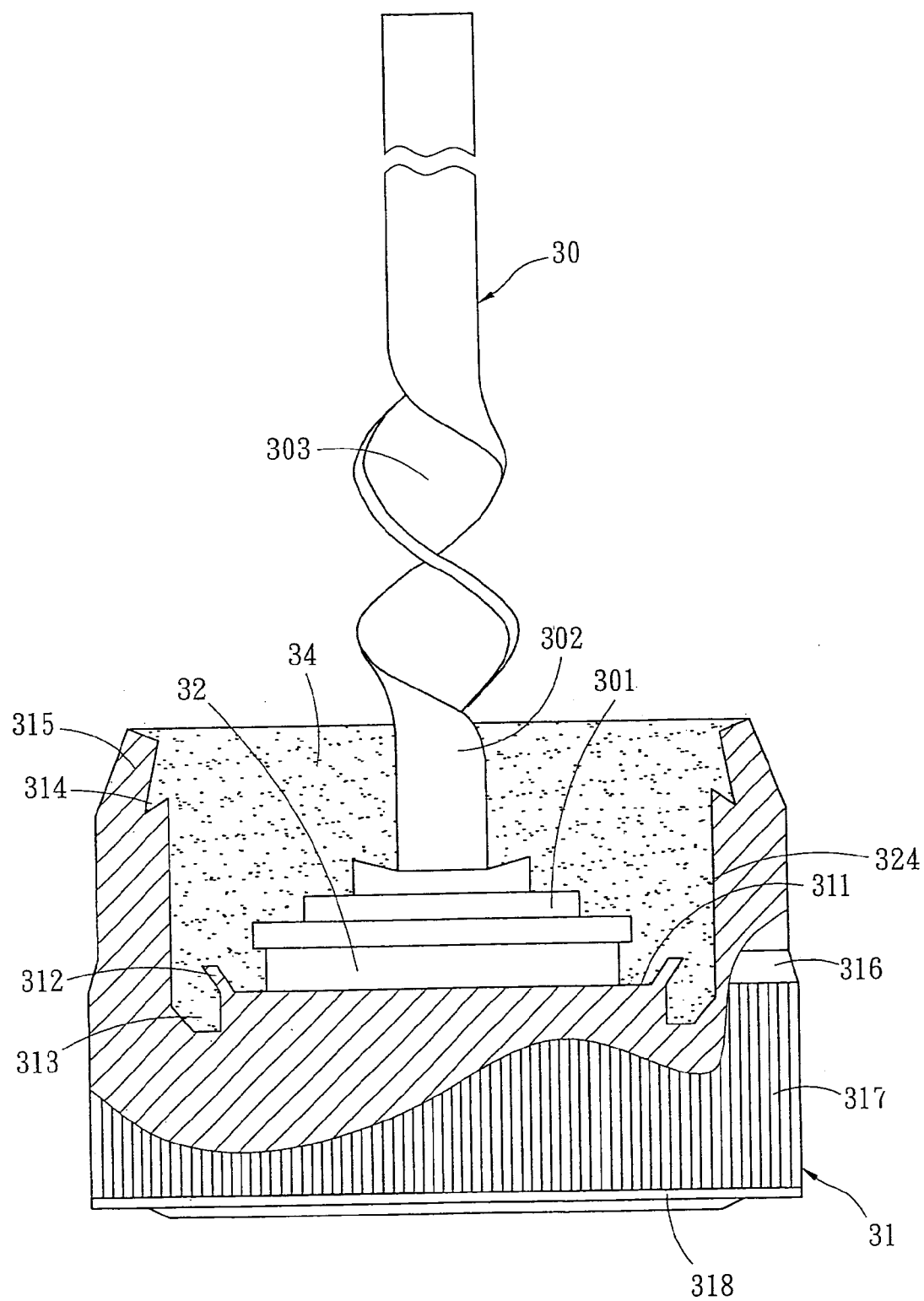
FIG. 4 is a sectional view of the invention.

Please referring to FIGS. 3 and 4, the rectification chip terminal according to the present invention includes a conductive element 30 located above a rectification chip 32. It includes a base 301 which is a multi-layer structure and has a recess on the top end. The base 301 is soldered on the back side of the rectification chip 32. The base 301 is extended upwards to form a root 302 which has one end connecting to a buffer portion 303 that has a helical structure to prevent bending and deformation under external forces. There is a base seat 31 for holding the rectification chip 32. It is formed like a cup and has a housing space 321 and a deck 311 for soldering the rectification chip 32. The deck 311 has a bulged ring 312 extended upwards at a biased angle for coupling with packaging material 34 filled during packaging. The deck 311 is surrounded by a spacer zone 313 which is an annular groove to form a stress buffer zone. The spacer zone 313 has a bending design to prevent moisture from seeping in through an inner wall 324 of the terminal. The upper side of the inner wall 324 has a bend spot 314 to couple with the packaging material 34 and prevent the moisture from seeping in. The upper peripheral side of the base seat 31 further has a first tapered section 315 inclining towards the center of the rectification chip terminal to form an inclined angle and a second tapered section 316 in the middle portion of the terminal periphery that has an inclined angle depending on the shrinking condition of the first tapered section 315. The base seat 31 has a grip portion 317 on a lower periphery that has a plurality of bulged traces except a lower rim 318 to smooth insertion and avoid damaging an insulation fabric covered after installation. By means of the structure set forth above, the problems occurred to the conventional designs can be overcome.

Figure 5:
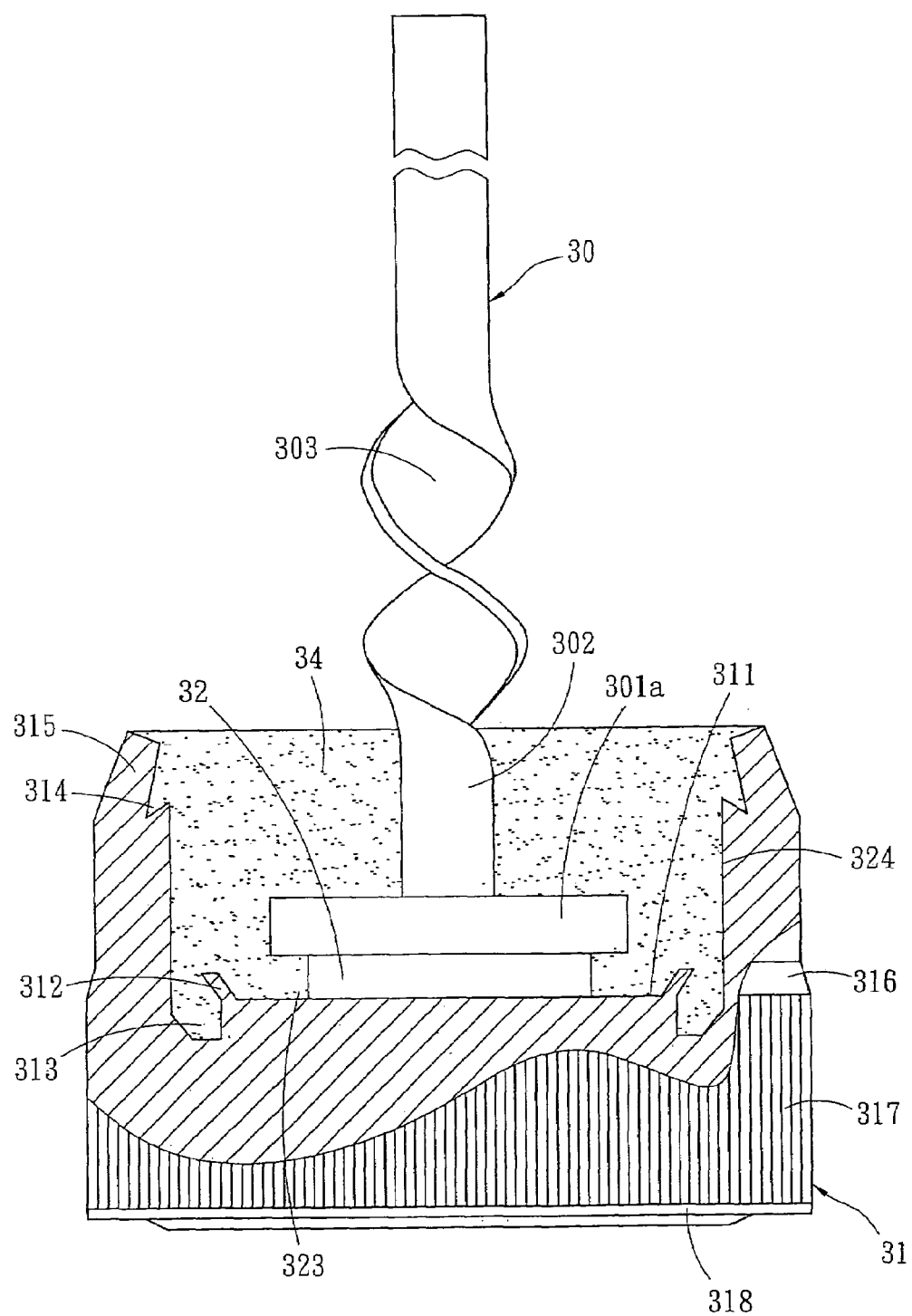
FIG. 5 is a sectional view of another embodiment of the invention.

Refer to FIG. 5 for another embodiment of the invention. The main difference from the one previously discussed is that the base 301a is a flat plate.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A rectification chip terminal structure for soldering a rectification chip on a terminal filled with a packaging material to form a secured mounting for the rectification chip to be inserted in a coupling bore of a circuit board, comprising:

a conductive element located above the rectification chip including a base to solder on a back side of the rectification chip, a root extended upwards from the base having one end connecting to a buffer portion which has a helical structure to prevent bending and deformation under external forces; and a base seat formed in a cup shape for holding the rectification chip having a housing space and a deck for soldering the rectification chip, the deck having a bulged ring extended upwards at a biased angle for coupling with the packaging material, the deck being surrounded by a spacer zone which is an annular groove to form a stress buffer zone, the spacer zone having a bending design to prevent moisture from seeping in through an inner wall of the terminal, the inner wall having a bend spot on a upper side to couple with the packaging material and prevent the moisture from seeping in, the base seat farther having a first tapered section on a upper peripheral side that forms an inclined angle directing towards the center of the terminal, a second tapered section in a middle portion of the terminal periphery that has an inclined angle depending on the shrinking condition of the first tapered section, and a grip portion on a lower periphery that has a plurality of bulged traces formed on the surface thereof except a lower rim to smooth insertion and avoid damaging an insulation fabric covered after installation.

2. The rectification chip terminal structure of claim 1, wherein the base is a multi-layer structure which has a recess on the top end.

3. The rectification chip terminal structure of claim 1, wherein the base is a flat plate.

* * * * *